United States Patent [19]

Pauling

[11] Patent Number: 5,158,588
[45] Date of Patent: Oct. 27, 1992

[54] METHOD OF DRAWING DISSOLVED SUPERCONDUCTOR

[75] Inventor: Linus C. Pauling, Big Sur, Calif.

[73] Assignee: Superbio, Inc., Palo Alto, Calif.

[21] Appl. No.: 702,141

[22] Filed: May 13, 1991

Related U.S. Application Data

[63] Continuation of Ser. No. 366,574, Jun. 15, 1989, abandoned, which is a continuation-in-part of Ser. No. 200,994, May 31, 1988, abandoned.

[51] Int. Cl.$^5$ .................... H01B 12/00; C03B 37/025; C03C 25/02
[52] U.S. Cl. .......................... 65/3.2; 65/13; 65/112; 505/729; 505/740
[58] Field of Search .................... 505/1, 701, 704, 730, 505/740, 733, 800, 813, 818, 821, 822, 823, 866, 915, 916, 918, 930; 65/3.11, 3.2, 13, 102; 264/56, 60, 61, 112, 165, 164, 174

[56] References Cited

U.S. PATENT DOCUMENTS

| | | | |
|---|---|---|---|
| 3,362,803 | 1/1968 | Dannohl | 65/3.2 |
| 3,664,143 | 5/1972 | Carroll | 62/3 |
| 3,728,165 | 4/1973 | Howlett | 505/930 |
| 3,748,728 | 7/1973 | Watson | 505/915 |
| 3,764,725 | 10/1973 | Kafka | 174/125.1 |
| 3,796,553 | 3/1974 | Daunt | 505/813 |
| 3,875,673 | 4/1975 | Good | 505/887 |
| 3,876,473 | 4/1975 | McDougall | 505/919 |
| 4,040,173 | 8/1977 | McDougall | 505/919 |
| 4,152,386 | 5/1979 | Winter | 505/822 |
| 4,181,515 | 1/1980 | Dyott | 65/3.11 |
| 4,277,270 | 7/1981 | Krohn | 65/3.11 |
| 4,325,795 | 7/1982 | Bourgoin | 505/816 |
| 4,349,636 | 1/1982 | Vahldiek | 501/87 |
| 4,411,959 | 10/1983 | Braginski | 505/813 |
| 4,693,865 | 9/1987 | Goto | 65/3.2 |
| 4,968,662 | 11/1990 | Urano et al. | 505/740 |
| 4,975,417 | 12/1990 | Koura | 505/740 |
| 5,037,800 | 8/1991 | Iijima et al. | 505/740 |
| 5,045,526 | 9/1991 | Nagesh et al. | 505/740 |

FOREIGN PATENT DOCUMENTS

| | | | |
|---|---|---|---|
| 61-227307 | 10/1986 | Japan | 65/3.2 |
| 63-294622 | 12/1988 | Japan | 505/740 |
| 63-313424 | 12/1988 | Japan | 505/740 |
| 1017325 | 1/1989 | Japan | |

OTHER PUBLICATIONS

Henry et al., Thin Film Growth of $YBa_2Cu_3O_x$ from nitrate solutions, Journal of Crystal Growth, vol. 85, Nov. 1987, pp. 615–618.

Rice et al., Preparation of $Ba_2YCu_3O_7$ by a novel spin-on pyrolysis, Applied Physics Letters, vol. 51, No. 22, Nov. 30, '87, pp. 1842–1844.

Cooper et al., Bismuth Strontium Calcium Copper Oxide Superconducting Films, Materials Letters, vol. 7, No. 1-2, Aug. 1988, pp. 5–8.

Cava et al., Superconductivity near 30K without copper: The $Ba_{0.6}K_{0.4}BiO_3$ Perouskite, Nature, vol. 332, Apr. 28, 1988, pp. 814–816.

Holland et al., Interplay of Synthesis, Structure, Microstructure and Superconducting Properties, Chemistry of High Temperature Superconductors, ACS Symposium Series 351, pp. 102–113, 1987.

Picone et al., Top Seeded Solution Growth of Lanthanum Copper Oxide, High Temperature Superconductors, Materials Research Society Symposium Proceedings, vol. 99, pp. 279–282, 1987.

(List continued on next page.)

Primary Examiner—Robert L. Lindsay
Attorney, Agent, or Firm—Townsend and Townsend

[57] ABSTRACT

A preform for drawing superconductive wire is prepared by mixing fine particles of a superconducting material, containing barium, potassium, bismuth and oxygen, with a solvent, containing potassium hydroxide, in a tube. When the preform is heated and drawn, the superconductive material dissolves in the solvent. As the fiber cools, the superconducting material deposits from the solution as a solid network of crystals in contact with one another.

9 Claims, 1 Drawing Sheet

OTHER PUBLICATIONS

Takagi et al., Growth of single crystals and films by a flux, High Temperature Superconductors, Materials Research Society Symposium Proceedings, vol. 99, pp. 647-650, 1987.

Wanklyn et al., The Flux Growth of Crystals of $YBa_2Cu_3O_{y-b}$, Solid State Communications, vol. 66, No. 4, pp. 441-443, Aug. 17, 1988.

Goto and Horiba, Japanese Journal of Applied Physics, vol. 26, No. 12, Dec., 1987, pp. L1970-L1972.

Jin, Materials Research Society Meeting, Apr. 21-24, 1987, Anaheim, Ca., "Fabrication of 91K Superconducting Coils".

M. Rabinowitz, "Quantum-Gas Model Estimate for Wide Range . . . ", Int. J. of Theoretical Phy., vol. 28, No. 2, pp. 137-146, 2/89.

Luhman, T.; J. Appl. Phys. 49(2), 2-1978, 936-938.

Reprinted from the Proceedings of the National Academy of Sciences; Linus C. Pauling; "The Resonating-Valence-Bond Theory of Superconductivity; Crest Superconductors and Trough Superconductors"; vol. 60, No. 1; pp. 59-65; May 1968.

*Physical Review Letters;* Linus C. Pauling; "Influence of Valence, Electronegativity, Atomic Radii, and Crest--Trough Interaction with Phonons on the High-Temperature Copper Oxide Superconductors"; vol. 59, No. 2, pp. 225-227; Jul. 13, 1987.

*Science;* Ron Dagani; "New Class of Superconducting Pushing Temperatures Higher"; May 16, 1988 C&EN; pp. 24-29.

*Letters to Nature;* J. L. Tallon et al.; "High-T Superconducting Phases in the Series $Bi_{2,1}$"; vol. 333; May 12, 1988; pp. 153-156.

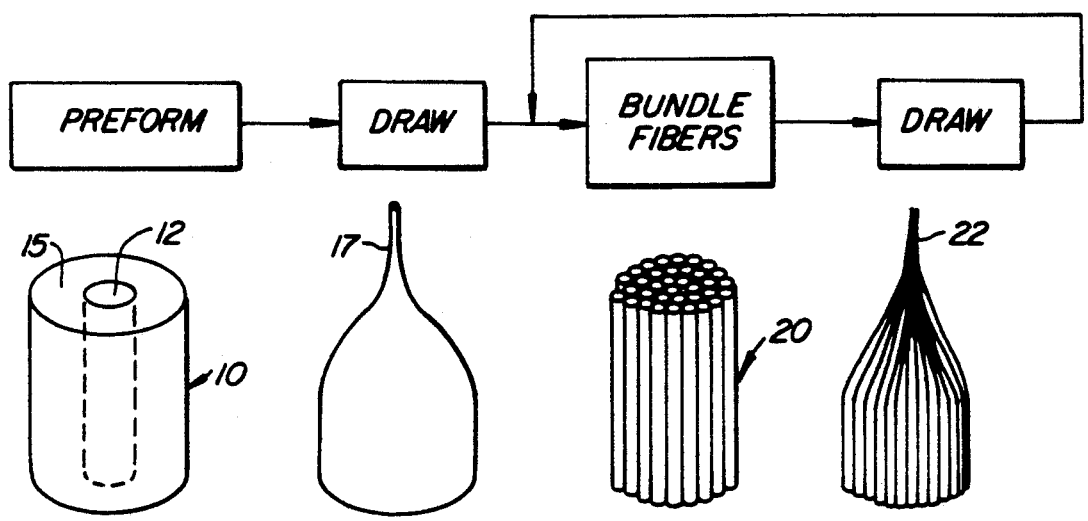
FIG.—1.
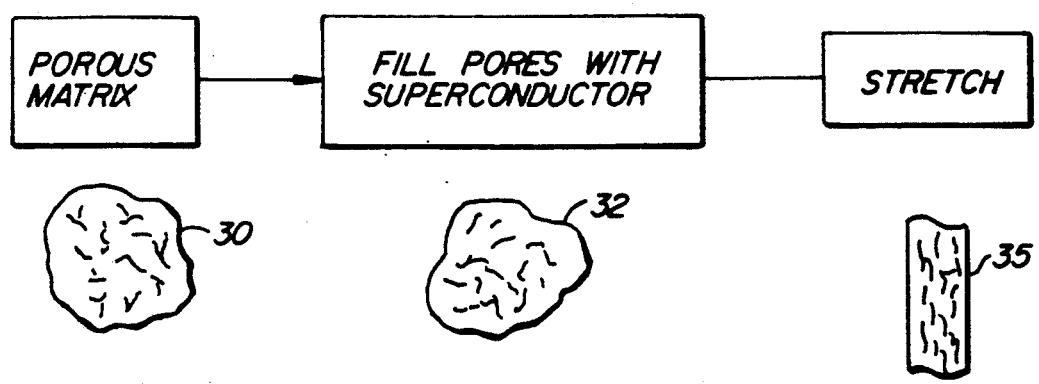
FIG.—2.
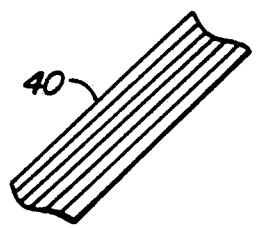
FIG.—3.

METHOD OF DRAWING DISSOLVED SUPERCONDUCTOR

This is a continuation of application Ser. No. 07/366,574, filed Jun. 15, 1989 which is a continuation of Ser. No. 07/200,994 filed May 31, 1981 now abandoned.

BACKGROUND OF THE INVENTION

The present invention relates generally to superconductors and more specifically to techniques for increasing the critical temperature of superconducting materials.

Until recently, the generally accepted theory of electric superconductivity of metals was based upon an assumed interaction between the conduction electrons and phonons in the crystals, and this theory was generally satisfactory in most respects. Known superconductors had critical temperatures below about 23° K. However, recent discoveries of high temperature superconductors ($T_c$ above 100° K.) have thrown the theoretical understanding of superconductivity into a state of confusion and controversy, and spurred the effort to find new materials with $T_c$ higher yet, perhaps room temperature.

SUMMARY OF THE INVENTION

The present invention provides a technique for increasing the critical temperature, critical magnetic field, and maximum current density of any of a range of already known superconducting materials.

In brief, the invention contemplates forming a composite structure having superconducting material in the form of fine strands embedded in a wave-guiding matrix. The superconducting current is thus restricted to essentially linear motion. The superconducting strands need not be straight, however, but could also be bent and interconnected into a network.

The matrix is formed of a material having sufficiently different electrical properties from those of the superconductor so as to preserve the integrity of the superconducting current along the strands. A number of the preferred embodiments use glass as the matrix material.

Various techniques may be employed to produce such a composite structure. For example, a composite billet or ingot may be formed of bars of the superconducting material surrounded by bars of the matrix material. This composite billet can then be rolled, forged, extruded, swaged, or stretched, at a suitable temperature, into a long composite fiber or rod, and the process repeated as needed to reduce the diameter of the strands of the superconducting material to a value to maximize the critical temperature. Alternatively, a porous matrix, such as an artificial zeolite or suitably porous aluminosilicate, can have its pores filled with the superconducting material, and the composite structure compacted into an ingot which is then swaged or stretched to extend and orient the superconductor-filled pores into a parallel alignment and reduce the diameter to maximize the critical temperature.

According to a further aspect of the present invention, strands of a crest superconductor and strands of a trough superconductor may be alternating and insulated from one another in the matrix, with the relative amounts of the two superconductors such as to give the smallest interaction with phonons.

A further understanding of the nature and advantages of the present invention can be realized by reference to the remaining portions of the specification.

BRIEF DESCRIPTION OF THE DRAWINGS

FIG. 1 shows a flow diagram of a first fabrication process with schematic representations of the result at each step;

FIG. 2 shows a flow diagram of an alternative fabrication process with schematic representations of the result at each step; and FIG. 3 shows a ribbon formed of superconducting composite fibers suitable for incorporation into a cable.

DETAILED DESCRIPTION OF THE PREFERRED EMBODIMENTS

Overview

The present invention is a technique for raising the critical temperature, critical magnetic field, and critical current density of superconducting materials. The technique entails embedding very fine strands of superconducting material in a matrix of material capable of serving as a waveguide for the superconducting current. The strands are generally round, say to within a factor of 2. Optimum strand diameters are likely to lie in the range 50-2000 angstroms.

Fabrication Techniques

FIG. 1 shows a preferred method of fabricating the requisite composite structure by drawing the superconducting material and the matrix material together into fine fiber form. For example, a preform 10 (generally on the order of 2 cm in diameter and 10 cm long) comprising one or more rods 12 of the superconducting material and surrounding matrix material 15 is first formed. The preform is then heated and drawn to a fiber 17, with the superconductive material as its core. A number of such fibers may be compacted into a new preform 20, and again drawn into a fiber 22, with this process repeated until the optimum diameter of the superconductive strands is reached. Alternatives to drawing the preform include well known rolling, forging, extruding, and swaging operations having the property of stretching a body of material to a much greater length with commensurate decrease in one or both transverse dimensions.

An alternative technique for fabricating a composite structure is by making a melt of such composition that it separates into two interpenetrating networks, one of the superconducting material and the other of the matrix material, which, when subjected to extension, produce long essentially parallel interconnected strands of the superconducting material with the appropriate diameter.

FIG. 2 shows an additional way of fabricating the composite structure by providing a porous matrix 30 of the desired wave-guiding material and then introducing the superconducting material into the pores. The resultant composite structure 32 could then be heated and extruded, stretched, or otherwise worked in such a way as to achieve an elongated structure 35 with the required diameter of the strands of superconducting material.

In one variation, a glass would be formed with a composition that involved two mutually interpenetrating phases, one lower in silica and the other higher in silica, such that when leached with acid, the lower silica phase dissolves, leaving the higher silica phase with a network of pores. Alternatively, an artificial zeolite with large pores could be used. Moreover, pellets of a suitably porous aluminosilicate or other similar material could be provided to be filled with the superconducting material. In any event, the porous matrix would be filled by molten superconducting material, and, if necessary, compacted into an ingot which is then stretched to extend and orient the superconductor-filled pores into parallel alignment at the right diameter.

Whatever the method of preparing the fibers, the fibers can be aligned laterally to form a ribbon 40, as shown in FIG. 3. In the construction of superconducting cable, these ribbons could be wound around a central strengthening core to form a helix, with another ribbon also forming a helix in the opposite sense and with each of the helixes having the optimum pitch to give the minimum interference by the magnetic field. Ribbons of copper or other good normal conductor could also be wound to form helixes inside, between, and outside the superconductor helixes to serve to conduct the charges and protect the cable in case of breakdown.

Choices of Material

The purpose of the matrix is to act as a waveguide for the superconducting current, and a wide range of non-conducting, semiconducting, and possibly even conductive materials may be suitable. However, if the fabrication techniques outlined above are to be used, semiconductors such as silicon and metalloids such as bismuth would tend to be unsuitable as being too brittle. Various types of glass appear to be the preferred matrix materials due to their ability to be drawn.

It is likely that most known superconducting materials will show a large increase in $T_c$ when incorporated as strands in the wave-guiding matrix, but the largest values of $T_c$ may be expected for superconductors having a relatively high bulk value of $T_c$, say 3° K. or more. The factors determining the critical temperature $T_c$ are not thoroughly understood. For example, Al and Mo have respective values of $T_c$ of 1.175° K. and 0.915° K. while the compound $Al_2CMo_3$ has a much higher value of $T_c$, namely 10.0° K.

However, for the benefits of the present invention to be available for a particular superconducting material, that material must be capable of being somehow formed into small strands. For example, if the process of drawing preforms into fibers is to work, the softening temperature of the glassy matrix must be above the melting point of the superconductor, or the superconductor must be sufficiently ductile at the softening temperature of the glassy matrix as to permit the increase in length of the superconductor to occur along with that of the glass.

The softening temperature of pure silica glass is about 1500° C., and that of high-silica glass containing rather small amounts of alkaline-earth metals and alkali metals is somewhat less. Thus these glasses should be suitable for use with high melting point materials such as Sc (m.p. 1539° C.) and the compounds $CSc_3Pb$ and $CSc_3Sn$ (perovskite structure, both crest and trough superconducting elements, Debye temperature raised by interstitial carbon).

Most silicate and borosilicate glasses have softening points around 700° C., and therefore can be used with low melting metals such as Sn (m.p. 232° C.), Pb (m.p. 327° C.), Ba (m.p. 714° C.), Sr (m.p. 768° C.), Na (m.p. 97.5° C.), and others, and with low melting compounds. The alkali metals, not themselves superconducting, form some superconducting compounds, even with Bi (not superconducting). BiK, $Bi_2K$, and BiLi have critical temperatures of 3.6° K., 3.6° K., and 2.5° K., respectively.

A further technique for improving the properties of the composite superconductor is to utilize a superconducting material having interstitial small atoms such as C or N. The presence of interstitial carbon often increases $T_c$; for example, from 0.915° K. for Mo to 12.2° K. for $CMo_2$ and from 4.47° K. for Ta to 9.7° K. for CTa.

Consider, however, that some materials, picked for certain desirable properties, are not as readily formed into small strands. For example, a material such as $Nb_3Sn$ with a high melting point and a high Debye temperature does not lend itself to being drawn into fine strands. However, fine strands may be obtained by a process as follows. Initially, the niobium is prepared as an extremely fine powder, as for example by reducing $NbF_5$ or $Nb_2O_5$ by hydrogen. This fine powder is made into a slurry with the stoichiometric composition by rapidly mixing it with molten tin, the slurry is immediately inserted into the preform, and the fiber is drawn in a time so short that the molten tin is not completely converted to $Nb_3Sn$. The composite material would then be annealed so as to convert all the strand material to the compound $Nb_3Sn$.

An improvement within the context of the composite superconductor of the present invention is to combine two different superconducting materials within the matrix. More particularly, strands of a crest superconductor and strands of a trough superconductor alternating and insulated from one another in the matrix, with the relative amounts of the two superconductors such as to give the smallest interaction with phonons should result in an increased Tc. A suitable composite structure would include strands of La (m.p. 920° C., bulk $T_c$ 6.0° K.) and Sn (m.p. 232° C., bulk $T_c$ 3.7° K.) embedded in a glass with a softening temperature of about 950° C.

One problem with certain superconductors is that the superconducting material may have such a high melting point as to make it impractical to draw a glass or other metal with the superconductor, as a liquid, in the lumen or lumens. There are several ways in which this difficulty can be overcome.

Some superconducting materials, in particular the oxide superconductors, are brittle. They can be comminuted or otherwise fractured, as for example by shock waves, into extremely small fragments. The lumen of the glass or other suitable material can be filled with this very fine powder, and then drawn in the method described above (see FIG. 1).

Another technique is to add a solvent so as to reduce the melting point to a value that permits the drawing to be done, with the superconducting material in solution in the liquid solvent. As the temperature is decreased, after the drawing has been carried out, the superconducting material would precipitate from the solution. If the amount of the solvent material is small, the resultant minute particles of superconducting material will be in touch with one another, giving a lattice that extends from one end of the fiber to the other. For example, if the superconducting material were to separate in the form of minute spheres, the amount of vacant space would be 24% or more, depending upon whether the spheres assume the relative configuration with a minimum of voids or a more open configuration. Hence if the amount of the solvent is less than one third of the amount (volume) of the superconducting material, the minute particles of superconducting material would be in contact with one another.

An example is the superconducting oxide of barium, potassium, bismuth, and oxygen, with approximately three times as many atoms of oxygen as of bismuth, and with the sum of the number of atoms of barium and potassium equal to the number of atoms of bismuth. This superconductor, with the amount of potassium about equal to that of barium or somewhat smaller, has, in the massive state, a superconducting temperature of about 30° K. The compound potassium hydroxide serves as a solvent for the compound. If the amount of potassium hydroxide is about one quarter as great as the amount of the superconducting material, the superconducting material is dissolved in the potassium hydroxide melt at around 400° K. Smaller amounts of potassium hydroxide will dissolve the superconducting material at a higher temperature. Accordingly, the amounts of the substances are such that, when minute crystals of the superconducting material deposit from the melt, they will be in contact with one another, and will form a network through the solidified material.

The composition of the glass or other supporting material can be fixed at such a value as, at a proper annealing temperature, to absorb the potassium hydroxide or other solvent, and to increase its volume in such a way as to decrease the diameter of the channels in which the superconducting material have been deposited.

Conclusion

In conclusion, it can be seen that the present invention provides a technique for increasing the critical temperature and other desirable parameters of a wide variety of superconductors. The fabrication techniques are sufficiently versatile to accommodate most materials of interest. By selecting the best superconducting and matrix materials and the optimum strand diameter, it should be possible to obtain a composite superconductor with critical temperature above room temperature, critical magnetic field above 100 tesla, and critical current density above 108 amperes per square centimeter.

While the above is a complete description of the preferred embodiments of the invention, various alternatives, modifications, and equivalents may be used. Therefore the above description should not be taken as limiting the scope of the invention which is defined by the appended claims.

What is claimed is:

1. A method of fabricating a high temperature superconductor comprising the steps of:
   providing a preform having an outer layer of non-superconducting material and an inner region containing a mixture of fine particles of superconducting material consisting essentially of barium, potassium, bismuth and oxygen and a solvent material consisting essentially of potassium hydroxide;
   drawing the preform into a fiber with the superconducting material as its core, said drawing step being carried out at a sufficiently high temperature that the solvent material melts and the superconducting material dissolves in the solvent material to form a solution; and
   decreasing the temperature of the fiber, so drawn, so that the superconducting material deposits from the solution as a solid network of crystals in contact with one another.

2. A method of fabricating a superconductor composition comprising the steps of:
   providing a preform having an outer layer of non-superconducting material and an inner region containing a mixture of fine particles of superconducting material and a solvent for said superconducting material;
   drawing the preform into a fiber with superconducting material as its core, said drawing step being carried out at a sufficiently high temperature that the superconducting material dissolves in the solvent material to form a solution; and
   decreasing the temperature of the fiber, so drawn, so that the superconducting material deposits from the solution as a solid network of crystals in contact with one another.

3. A method of fabricating a superconductor composition comprising the steps of:
   providing a preform having an outer layer of non-superconducting material and an inner region containing a mixture of fine particles of superconducting material and a solvent that consists essentially of potassium hydroxide;
   drawing the preform into a fiber with superconducting material as its core, said step of drawing being carried out at a sufficiently high temperature that the superconducting material dissolves in the solvent material to form a solution; and
   decreasing the temperature of the fiber, so drawn, so that the superconducting material deposits from the solution as a solid network of crystals in contact with one another.

4. The method of claim 3 wherein the superconducting material is an oxide superconductor.

5. The method of claim 2 wherein the superconducting material consists essentially of barium, potassium, bismuth, and oxygen.

6. A method of fabricating a superconductor composition comprising the steps of:
   providing a preform having an outer layer of non-superconducting material and an inner region containing a mixture of fine particles of superconducting material and a solvent for said superconducting material, said superconducting material selected from the group consisting of Al, Mo, $Al_2$, $CMo_3$, $CSc_3Pb$, $CSc_3Sn$, $Bik$, $Bi_2k$, $BiLi$, $CMo_2$, Ta, CTa, $Nb_3Sn$, La, and Sn;
   drawing the preform into a fiber with superconducting material as its core, said drawing step being carried out at a sufficiently high temperature that the superconducting material dissolves in the solvent material to form a solution; and
   decreasing the temperature of the fiber, so drawn, so that the superconducting material deposits from the solution as a solid network of crystals in contact with one another.

7. The method of claim 2 wherein said solvent is present in a volumetric amount of less than one-third the volumetric amount of the superconducting material.

8. The method of claim 2 wherein said fiber has a diameter of between about 50 and 2,000 Å.

9. The method of claim 2 wherein said fiber has a diameter of between about 50 and 2,000 Å.

* * * * *